(12) United States Patent
Lenchenkov et al.

(10) Patent No.: US 9,584,744 B2
(45) Date of Patent: Feb. 28, 2017

(54) IMAGE SENSORS WITH VOLTAGE-BIASED TRENCH ISOLATION STRUCTURES

(71) Applicant: SEMICONDUCTOR COMPONENTS INDUSTRIES, LLC, Phoenix, AZ (US)

(72) Inventors: Victor Lenchenkov, Sunnyvale, CA (US); Hamid Soleimani, Cupertino, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/747,021

(22) Filed: Jun. 23, 2015

(65) Prior Publication Data
US 2016/0381310 A1 Dec. 29, 2016

(51) Int. Cl.
H04N 5/359 (2011.01)
H04N 5/225 (2006.01)
H01L 27/146 (2006.01)

(52) U.S. Cl.
CPC ......... *H04N 5/359* (2013.01); *H01L 27/1463* (2013.01); *H01L 27/14623* (2013.01); *H04N 5/2254* (2013.01)

(58) Field of Classification Search
CPC ............................. H04N 5/335; H04N 5/359
USPC ........................................................ 348/302
See application file for complete search history.

(56) References Cited

U.S. PATENT DOCUMENTS

| 5,552,629 A | * | 9/1996 | Watanabe ............ B82Y 20/00 257/186 |
| 6,780,730 B2 | | 8/2004 | Lin |
| 6,995,049 B2 | | 2/2006 | Takahashi |
| 7,492,027 B2 | | 2/2009 | Mouli |

(Continued)

FOREIGN PATENT DOCUMENTS

| CN | 102315155 A | * | 1/2012 | ........... H01L 21/762 |
| JP | 2011003860 A | * | 1/2011 | ........... H01L 27/146 |

OTHER PUBLICATIONS

CN 102315155 A; English Translation; Jan. 2012.*

(Continued)

*Primary Examiner* — Roberto Velez
*Assistant Examiner* — Cynthia Segura
(74) *Attorney, Agent, or Firm* — Treyz Law Group, P.C.; Jason Tsai; Joseph F. Guihan

(57) ABSTRACT

An image sensor with an array of image sensor pixels is provided. Each pixel may include a photodiode, a storage diode, and associated circuitry formed in a semiconductor substrate. Buried light shields may be formed on the substrate to prevent regions between two adjacent photodiodes from being exposed to incoming light. In one embodiment, a shallow trench isolation (STI) structure may be formed between the photodiode and the storage diode, and a conductive layer formed from optically absorptive material may be constructed at the bottom of the STI structure. A via may be formed through the STI structure to help bias the conductive layer using a ground or negative voltage. In another embodiment, an isolation ring structure may be formed at the base of the buried light shields. The isolation ring structure may be formed from optically absorptive material and can optionally be biased using a ground or negative voltage.

11 Claims, 8 Drawing Sheets

(56) References Cited

U.S. PATENT DOCUMENTS

| | | | |
|---|---|---|---|
| 7,615,396 B1* | 11/2009 | Lee | H01L 21/761 |
| | | | 257/461 |
| 8,492,865 B2 | 7/2013 | Venezia et al. | |
| 8,716,823 B2* | 5/2014 | Lenchenkov | H01L 27/14627 |
| | | | 257/432 |
| 9,041,081 B2* | 5/2015 | Lenchenkov | H01L 27/14609 |
| | | | 257/292 |
| 9,232,162 B2* | 1/2016 | Lenchenkov | H01L 27/14623 |
| 9,478,574 B2* | 10/2016 | Lenchenkov | H01L 27/14627 |
| 2002/0089004 A1* | 7/2002 | Rhodes | H01L 27/14601 |
| | | | 257/290 |
| 2003/0089929 A1* | 5/2003 | Rhodes | H01L 27/14601 |
| | | | 257/219 |
| 2006/0017072 A1 | 1/2006 | Dosluoglu | |
| 2007/0026326 A1* | 2/2007 | Kim | H01L 27/14689 |
| | | | 430/57.3 |
| 2008/0061375 A1* | 3/2008 | Williams | H01L 21/26513 |
| | | | 257/371 |
| 2009/0266973 A1 | 10/2009 | Roy et al. | |
| 2010/0013031 A1* | 1/2010 | Schoen | B81C 1/00507 |
| | | | 257/415 |
| 2010/0271524 A1 | 10/2010 | Venezia et al. | |
| 2011/0156186 A1* | 6/2011 | Iida | H01L 27/1463 |
| | | | 257/432 |
| 2013/0113968 A1* | 5/2013 | Lenchenkov | H01L 27/14623 |
| | | | 348/302 |
| 2013/0292548 A1 | 11/2013 | Agranov et al. | |
| 2014/0015085 A1* | 1/2014 | Ikeda | H01L 31/02325 |
| | | | 257/432 |
| 2014/0077061 A1 | 3/2014 | Lenchenkov | |
| 2014/0078359 A1* | 3/2014 | Lenchenkov | H01L 27/14627 |
| | | | 348/294 |
| 2015/0035028 A1* | 2/2015 | Fan | H01L 27/14623 |
| | | | 257/432 |
| 2015/0060966 A1* | 3/2015 | Lenchenkov | H01L 27/14609 |
| | | | 257/292 |
| 2016/0204150 A1* | 7/2016 | Oh | H01L 27/14623 |
| | | | 257/229 |

OTHER PUBLICATIONS

Lenchenkov et al., U.S. Appl. No. 14/469,498, filed Aug. 26, 2014.
Lenchenkov et al., U.S. Appl. No. 14/464,408, filed Aug. 20, 2014.

* cited by examiner

IMAGE SENSORS WITH VOLTAGE-BIASED TRENCH ISOLATION STRUCTURES

BACKGROUND

This relates generally to image sensors, and more specifically, to image sensors operable in global shutter mode.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

A dielectric stack is formed on the substrate over the photodiodes. The dielectric stack includes metal routing lines and metal vias formed in dielectric material. Light guides are often formed in the dielectric stack to guide the trajectory of incoming light. A color filter array is typically formed over the dielectric stack to provide each pixel with sensitivity to a certain range of wavelengths. Microlenses are formed over the color filter array. Light enters the microlenses and travels through the color filters into the dielectric stack.

In a conventional image sensor configured to operate in global shutter mode, each image sensor pixel includes a photodiode for detecting incoming light and a separate storage diode for temporarily storing charge. The storage diode should not be exposed to incoming light. In such arrangements, structures such as tungsten buried light shields (abbreviated as WBLS) are formed on the substrate between neighboring photodiodes to help prevent stray light from affecting the storage diode. At least some metal vias are formed through gaps in the buried light shields in order to control pixel transistors formed between two adjacent photodiodes. Shielding storage diodes in this way can help reduce crosstalk and increase global shutter efficiency (i.e., the buried light shields are designed to prevent stray light from entering regions of the substrate located between two adjacent photodiodes).

In practice, however, the tungsten buried light shield reflects stray light. The reflected stray light may be scattered through the existing gaps in the buried light shield and corrupt the storage diode. Moreover, charge generated at the edges of the photodiode may sometimes inadvertently leak to adjacent storage diodes. This results in undesirable pixel crosstalk and degraded global shutter efficiency.

It is within this context that the embodiments described herein arise.

DETAILED DESCRIPTION

Embodiments of the present invention relate to image sensors, and more particularly, to image sensors with intra-pixel isolation structures. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
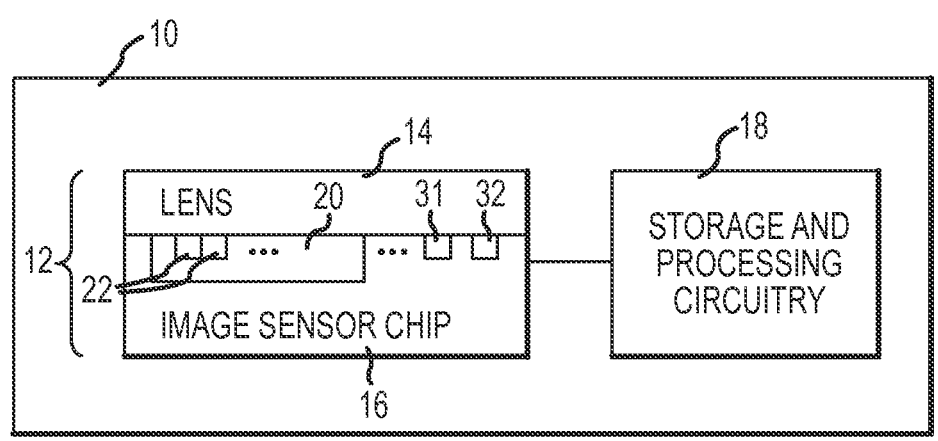
FIG. 1 is a diagram of an illustrative electronic device in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Embodiments of the present invention relate to image sensor pixels configured to support global shutter operation. For example, the image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis.

Figure 2:
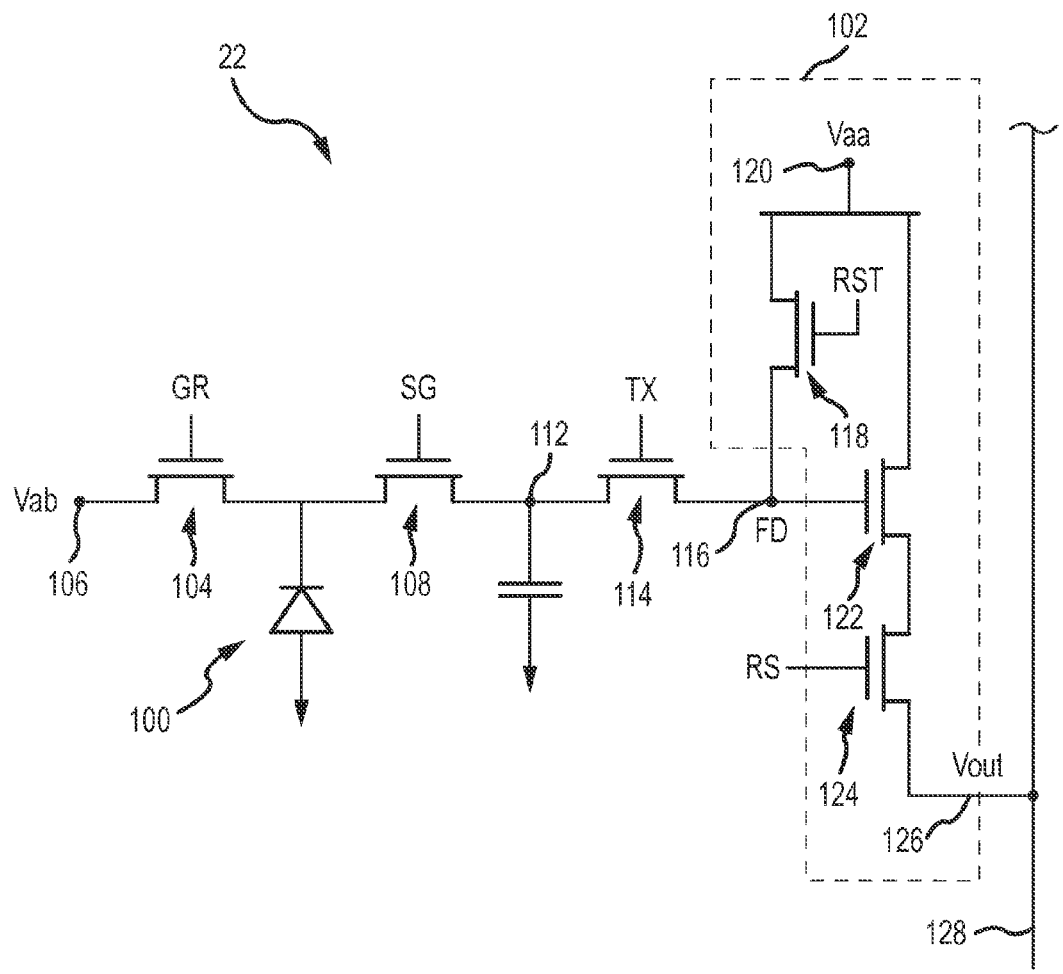
FIG. 2 is a diagram of an illustrative image sensor pixel that may be used to support global shutter operation in accordance with an embodiment.

FIG. 2 is a circuit diagram of an illustrative image sensor pixel 22 operable in global shutter mode. As shown in FIG. 2, pixel 22 may include a photosensitive element such as photodiode 100. A first (positive) power supply voltage Vaa may be supplied at positive power supply terminal 120. A second power supply voltage Vab may be supplied at second power supply terminal 106. Incoming light may be collected by photodiode 100. Photodiode 100 may then generate charge (e.g., electrons) in response to receiving impinging photons. The amount of charge that is collected by photodiode 100 may depend on the intensity of the impinging light and the exposure duration (or integration time).

Before an image is acquired, reset control signal RST may be asserted. Asserting signal RST turns on reset transistor 118 and resets charge storage node 116 (also referred to as floating diffusion region FD) to Vaa. Reset control signal RST may then be deasserted to turn off reset transistor 118. Similarly, prior to charge integration, a global reset signal GR may be pulsed high to reset photodiode 100 to power supply voltage Vab (e.g., by passing Vab to photodiode 100 through global reset transistor 104).

Pixel 22 may further include a storage transistor 108 operable to transfer charge from photodiode 100 to storage node (sometimes called a charge storage region or storage region) 112. Charge storage region 112 may be a doped semiconductor region (e.g., a doped silicon region formed in a silicon substrate by ion implantation, impurity diffusion, or other doping techniques) that is capable of temporarily storing charge transferred from photodiode 100. Region 112 that is capable of temporarily storing transferred charge is sometimes referred to as a "storage diode" (SD).

Pixel 22 may include a transfer gate (transistor) 114. Transfer gate 114 may have a gate terminal that is controlled by transfer control signal TX. Transfer signal TX may be pulsed high to transfer charge from storage diode region 112 to charge storage region 116 (sometimes called a "floating diffusion" region). Floating diffusion (FD) region 116 may be a doped semiconductor region (e.g., a region in a silicon substrate that is doped by ion implantation, impurity diffusion, or other doping processes). Floating diffusion region 116 may serve as another storage region for storing charge during image data gathering operations.

Pixel 22 may also include readout circuitry such as charge readout circuit 102. Charge readout circuit 102 may include row-select transistor 124 and source-follower transistor 122. Transistor 124 may have a gate that is controlled by row select signal RS. When signal RS is asserted, transistor 124 is turned on and a corresponding signal Vout (e.g. an output signal having a magnitude that is proportional to the amount of charge at floating diffusion node 116) is passed onto output path 128.

Image pixel array 20 may include pixels 22 arranged in rows and columns. A column readout path such as output line 128 may be associated with each column of pixels (e.g., each image pixel 22 in a column may be coupled to output line 128 through respective row-select transistors 124). Signal RS may be asserted to read out signal Vout from a selected image pixel onto column readout path 124. Image data Vout may be fed to circuitry 18 for further processing. The circuitry of FIG. 2 is merely illustrative. If desired, pixel 22 may include other pixel circuitry.

Figure 3:
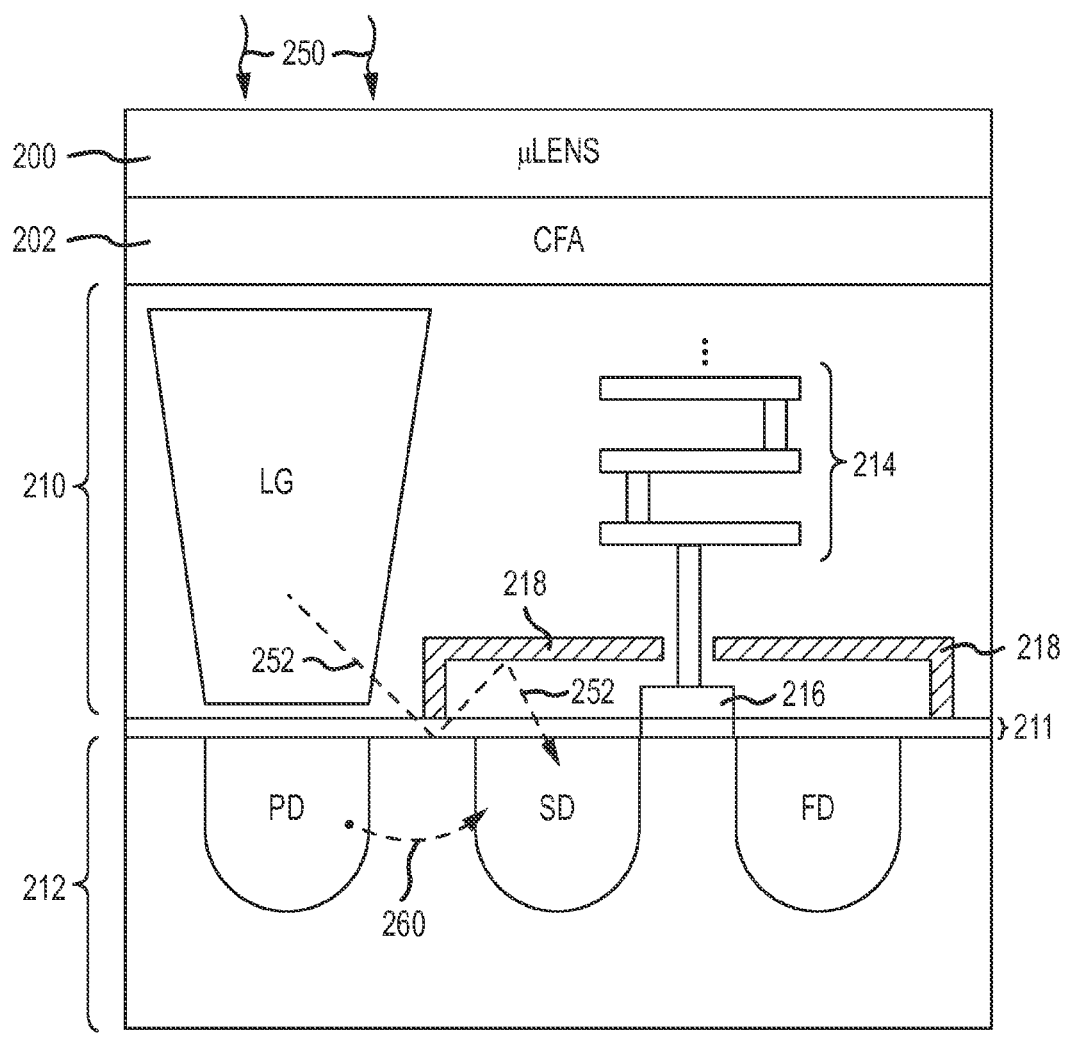
FIG. 3 is a cross-sectional side view of a conventional image sensor with buried light shields.

FIG. 3 is a cross-sectional side view of a conventional image sensor pixel for supporting global shutter mode. As shown in FIG. 3, the pixel includes a photodiode PD formed in a p-type substrate 212, a storage diode SD, a floating diffusion region FD, and a storage gate conductor 216 (i.e., a gate conductor of the charge transfer transistor) that is formed on substrate 212 between storage diode SD and floating diffusion region FD. The gate conductor of the storage transistor linking the photodiode PD and the storage diode SD is omitted from FIG. 3 for clarity.

A dielectric stack 210 is formed on substrate 212. A light guide LG for directing incoming light towards the photodiode is formed directly above the photodiode in dielectric stack 210. Metal interconnect routing paths 214 are formed in dielectric stack 210 adjacent to the light guide. At least some of the metal routing paths 214 makes contact with gate conductor 216 for controlling the charge transfer transistor.

A color filter array (CFA) 202 is formed over dielectric stack 210. Microlens structures 200 may be formed over the color filter array 202. Ideally, incoming light 250 enters the microlens structures 200 from above and is directed towards the corresponding photodiodes. In practice, however, stray light may potentially strike regions on substrate 212 between adjacent photodiodes and result in undesired crosstalk and reduction in global shutter efficiency (i.e., stray light may undesirably affect the amount of charge in storage diode region SD). Regions on substrate 212 where light should not be allowed to strike may be referred to as "dark" regions.

In an effort to prevent stray light from entering the dark regions, tungsten buried light shields 218 are sometimes formed to partially cover the dark regions (i.e., light shields 218 are designed to shield region SD and gate conductor 216). The tungsten buried light shields 218 are typically formed on a passivation layer 211 or other suitable dielectric layer on the surface of substrate 212. There may be gaps in the buried light shields through which interconnects 214 are formed to make contact with circuitry in the dark regions and gaps between the base of the tungsten buried light shields 218 and the surface of substrate 212.

Because the tungsten buried light shields 218 are reflective, stray light can sometimes enter these gaps and reflect off the tungsten buried light shields 218 and be inadvertently scattered into the dark regions (as indicated by path 252).

Moreover, charge generated at the fringe of the photodiode can also sometimes leak into the storage diode, which can degrade signal integrity. It may therefore be desirable to provide improved ways for electrically and optically isolating the dark regions.

Figure 4:
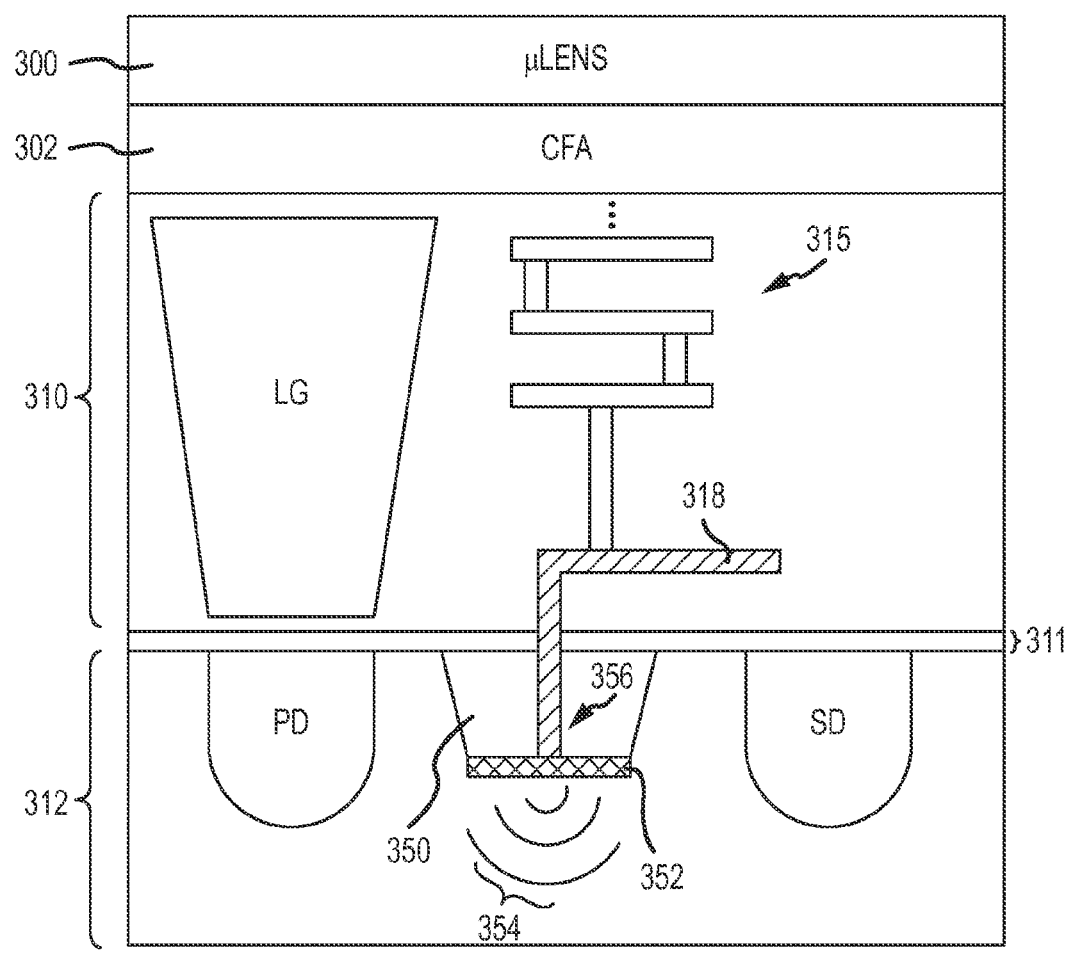
FIG. 4 is a cross-sectional side view of an illustrative image sensor having a contact formed through a shallow trench isolation structure in accordance with an embodiment.

In accordance with an embodiment of the present invention, image sensor pixels may be provided with electrically-biased isolation structures between the photodiode and the storage diode. As shown in FIG. 4, an image sensor pixel may include a photodiode PD and a storage diode SD formed in a semiconductor substrate 312 (e.g., a p-type substrate). A passivation layer 311 or other suitable dielectric liner may be formed at the surface of substrate 312. A dielectric stack 310 may be formed on layer 311. Dielectric stack 310 may include alternating metal interconnect routing layers and metal via layers and is therefore sometimes referred to as interconnect layers. A light guide LG may be formed directly over photodiode PD in the dielectric stack 310. A light shielding structure such as a tungsten buried light shield 318 may also be formed partially over the storage diode SD region.

A color filter array (CFA) 302 (e.g., an array of color filter elements configured to pass different wavelengths of light) may be formed over the dielectric stack 310. Microlens structures 300 (e.g., an array of microlens for focusing light towards respective photodiodes in the substrate) may be formed over the color filter array 302.

Still referring to FIG. 4, a shallow trench isolation (STI) structure such as STI structure 350 may be formed in the substrate 312 between the photodiode PD and the storage diode SD. In accordance with an embodiment, a conductive layer 352 may be formed at the bottom of STI structure 350. Conductive layer 352 may be formed from tungsten, tantalum, titanium, silicon, nitride, oxide, a combination of these materials, or other suitable materials exhibiting high optical absorption.

In particular, a conductive via such as via 356 may be formed through STI structure 350 to make electrical contact with conductive layer 352. In this example, via 356 may be an integral part of buried light shield 318 (e.g., via 356 and light shield 318 are part of the same contiguous structure). In this scenario, buried light shield 318 may be connected to interconnect routing structures 315 formed in dielectric stack 310 and may be biased to some desired voltage via these interconnect routing structures 315. For example, it may be desirable to apply a ground voltage (e.g., zero volts) or some negative voltage to routing structures 315 so as to bias conductive layer 352 to create a potential barrier 354 in the vicinity of STI structure 350.

Conductive layer 352 formed and operated in this way can provide at least two technical advantages. Optically, layer 352 may serve to absorb any stray light that may have inadvertently propagated through gaps in the buried light shield 318. Electrically, layer 352 biased to some desired voltage level can create a potential barrier 354 that helps to prevent any stray charge at the fringe/edge of photodiode PD from inadvertently leaking into the storage diode region SD. Image sensor pixels formed as such can exhibit substantially enhanced optical isolation of the storage diode, thereby improving global shutter efficiency.

Figure 5:
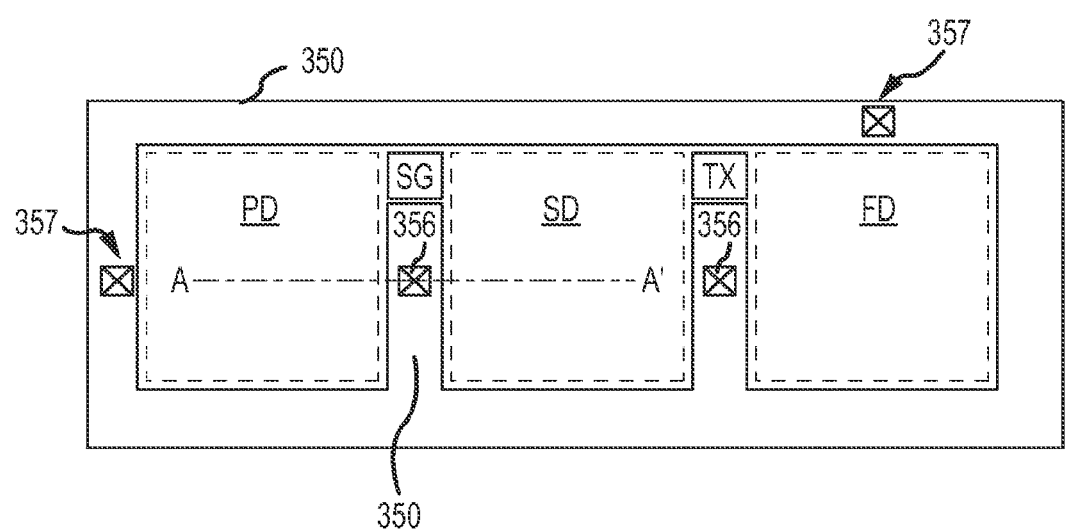
FIG. 5 is a top view showing illustrative shallow trench isolation structures surrounding different charge storage regions in an image sensor pixel in accordance with an embodiment.

FIG. 5 is a top view showing how shallow trench isolation structures 350 may be formed. As shown in FIG. 5, shallow trench isolation structures 350 may surround the photodiode PD, the storage diode SD, and the floating diffusion region FD. The storage gate conductor SG and the charge transfer transistor TX may be formed over regions over the substrate where the STI structures 350 are absent. A cut along line AA' may reveal the cross section of FIG. 4.

As shown in both FIGS. 4 and 5, contact vias 356 may be formed between the photodiode and storage diode regions. This is, however, merely illustrative. If desired, the contact vias formed through the STI structures 350 may be formed at other locations 357, as long as the conductive layer 352 that is interposed between the photodiode and the storage diode (and also optionally between the storage diode and the floating diffusion region) is biased to create the desired potential barrier.

Figure 6:
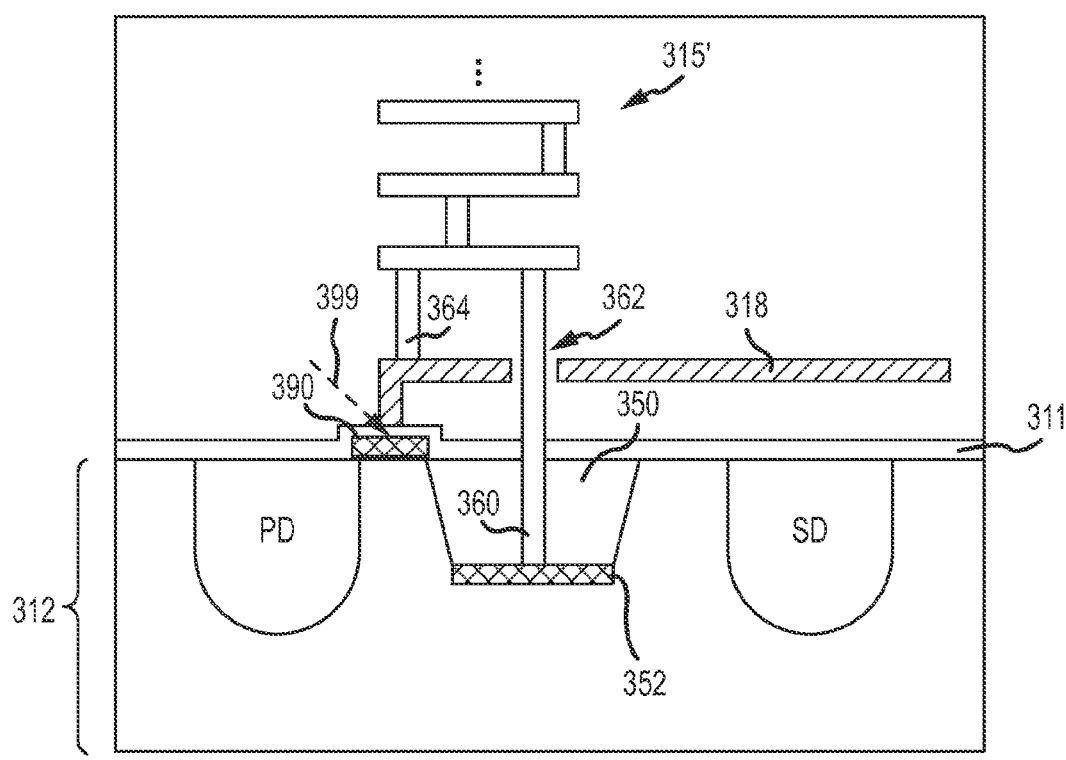
FIG. 6 is a cross-sectional side view of an illustrative image sensor of the type shown in FIG. 4 that also includes an isolation ring structure in accordance with an embodiment.

In accordance with another suitable embodiment, an isolation ring structure such as isolation ring structure 390 may be formed to further improve optical isolation. As shown in FIG. 6, isolation ring structure 390 may be formed on the surface of substrate 312 directly below the base of the buried light shield 318. Since the buried light shield is formed over the dark regions having a circular base (see, wider view in FIG. 3), isolation structure 390 may have a ring shape that coincides with the base portion of the light shield 318.

Ring structure 390 may be formed from tungsten, tantalum, titanium, silicon, nitride, oxide, a combination of these materials, or other suitable materials exhibiting high optical absorption. Formed in this way, structure 390 may serve to absorb any stray light that may have inadvertently propagated through gaps near the base of the buried light shield 318. In the example of FIG. 6, conductive layer 352 may be formed as a separate structure from the buried light shield 318. Regardless, buried light shield 318 may be coupled to interconnect routing structures 315' through via 364 while conductive layer 352 may be coupled to structures 315' through via 360 that traverses a gap 362 in the light shield 318 so that both can receive some desired voltage level.

If desired, layer 352 and light shield 318 may be coupled to different interconnect routing paths for receiving difference voltage levels. As an example, the light shield 318 may receive a ground voltage, whereas the STI conductive layer 352 may be biased to a negative voltage. As another example, the light shield 318 may receive a negative voltage, whereas the STI conductive layer 352 may be biased to a ground voltage. These examples are merely illustrative and do not serve to limit the scope of the present invention.

Figure 7:
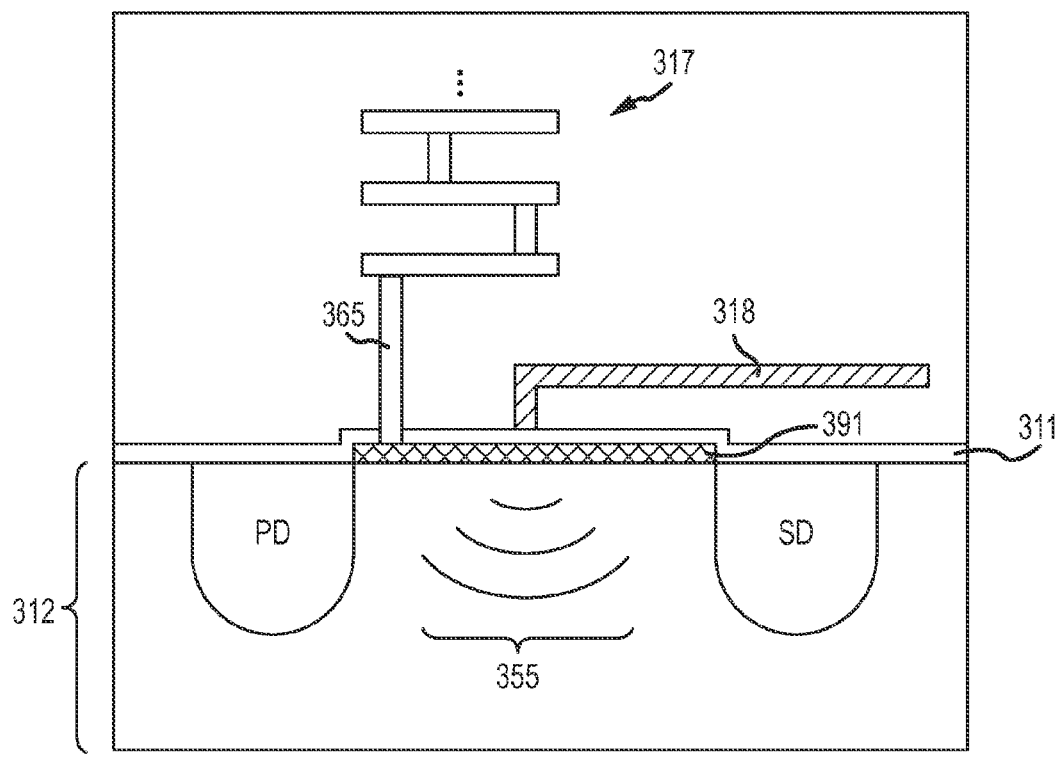
FIG. 7 is a cross-sectional side view of an illustrative image sensor having a voltage-biased isolation ring structure in accordance with an embodiment.

FIG. 7 shows yet another suitable embodiment in which isolation ring structure 391 may be biased to some desired voltage level. As shown in FIG. 7, ring structure 391 may be coupled to metal routing structures 317 through conductive via 365 so that ring structure 391 may receive a ground voltage or a negative voltage. Biased in this way, a potential barrier 355 may be formed beneath structure 391, which can help prevent charge generated at the edges of the photodiode from leaking into the storage diode region SD and can also obviate the use of an electrically biased STI structure (as described in connection with the embodiments of FIGS. 4-6). Passivation layer 311 may be formed on substrate 312 over the isolation ring structure 319. Buried light shield 318 may be formed on the passivation layer 311.

Configured in this way, the isolation ring structure 391 may provide at least two advantages. Electrically, structure 391 that is biased to some desired voltage level may create a potential barrier 354 that helps to prevent any stray charge at the fringe/edge of photodiode PD from inadvertently leaking into the storage diode region SD. Optically, structure 391 may serve to absorb any stray light that may have inadvertently propagated through gaps near the base of the buried light shield 318. Image sensor pixels formed as such can exhibit substantially enhanced optical isolation of the storage diode, thereby improving global shutter efficiency.

In general, the buried light shied 318 should also be biased to some fixed voltage level using conductive vias (not shown so as to not unnecessarily obscure FIG. 7). In other suitable embodiments, isolation ring structure 391 may be shorted to light shield 318 (e.g., via 365 may be formed as an integral part of light shield 318), and light shield 318 may be coupled to corresponding routing structures in the dielectric stack to receive some appropriate bias voltage, similar to the example of FIG. 4.

The examples described herein in which the conductive layer formed at the bottom of the STI structures and the optical isolation ring structure formed at the base of the buried light are biased to a ground voltage or a negative voltage level are merely illustrative. If desired, STI conductive layer 352 and/or isolation ring structure 390/391 may be biased using a positive voltage, a fixed power supply voltage, or an adjustable control voltage.

The embodiments described thus far relate to image sensors operating in global shutter mode. If desired, the embodiments of the present invention can also be applied to image sensors operating in rolling shutter mode to help reduce optical pixel cross-talk.

Figure 8:
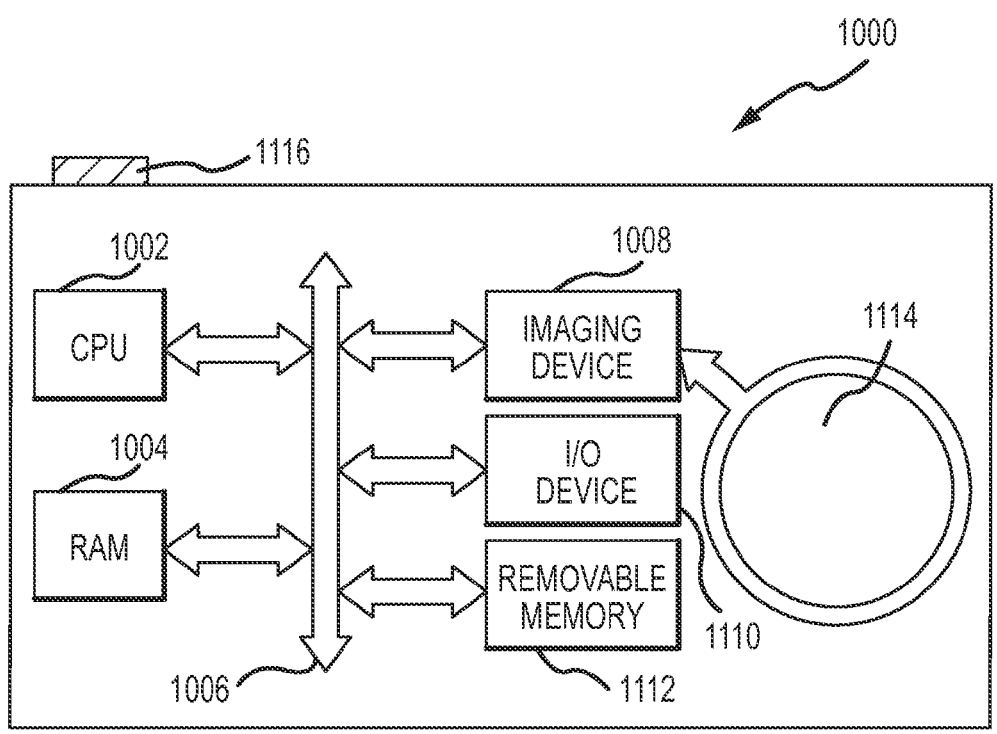
FIG. 8 is a block diagram of a processor system that may employ some of the embodiments of FIGS. 4-7 in accordance with an embodiment of the present invention.

FIG. 8 is a simplified diagram of an illustrative processor system 1000, such as a digital camera, which includes an imaging device 1008 (e.g., the camera module of FIG. 1) employing an imager having pixels with optical/electrical isolation structures as described above. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating imaging systems with conductively biased isolation structures. A system may include an image sensor module with an array of image sensor pixels and one or more lenses that focus light onto the array of image sensor pixels (e.g., image pixels arranged in rows and columns).

In accordance with an embodiment, the image sensor may include a substrate, a first charge storage region (e.g., a photodiode) formed in the substrate, a second charge storage region formed in the substrate (e.g., a storage diode for global shutter operation), a shallow trench isolation (STI) structure that is interposed between the first and second charge storage regions in the substrate, and a conductive layer that is formed at the bottom of the STI structure. The conductive layer may be formed from optically absorptive material to help absorb stray light. In particular, a conductive via may be formed through the STI structure to make direct contact with the conductive layer. The conductive via may be configured to receive a ground voltage or a negative voltage. Biased in this way, the conductive layer at the bottom of the STI structure can help create a potential barrier that prevents charge from leaking between the first and second charge storage regions.

The image sensor may also include a buried light shielding structure that is formed at least partially over the second charge storage region and that is optionally shorted to the conductive layer. In accordance with another embodiment, the image sensor may also include an isolation ring structure that is formed below a base portion of the buried light shielding structure and that is formed from optically absorptive material. A passivation layer or other dielectric liner may be interposed between the buried light shield and the isolation ring structure. The isolation ring structure may also be biased to a ground or negative voltage. In certain arrangements, the use of an electrically-biased ring structure may obviate the need to have an electrically-biased STI structure as described above in the preceding embodiment.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   a substrate;
   a first charge storage region formed in the substrate;
   a second charge storage region formed in the substrate;
   a shallow trench isolation (STI) structure that is interposed between the first and second charge storage regions in the substrate;
   a conductive layer that is formed at the bottom of the STI structure; and
   a conductive via that is formed through the STI structure to make direct contact with the conductive layer, wherein the conductive via is formed separately from the conductive layer and wherein the conductive layer is biased with a bias voltage to provide a potential barrier between the first charge storage region and the second charge storage region.

2. The image sensor defined in claim 1, wherein the conductive via is configured to receive the bias voltage and wherein the bias voltage is a ground voltage.

3. The image sensor defined in claim 1, wherein the conductive via is configured to receive the bias voltage and wherein the bias voltage is a negative voltage.

4. The image sensor defined in claim 1, wherein the first charge storage region comprises a photodiode, the image sensor further comprising:
   a buried light shielding structure that is formed at least partially over the second charge storage region and that is shorted to the conductive layer.

5. The image sensor defined in claim 4, further comprising:
   an isolation ring structure that is formed at the base of the buried light shielding structure and that is formed from optically absorptive material.

6. The image sensor defined in claim 1, wherein the conductive layer is formed from optically absorptive material.

7. A system, comprising:
   a central processing unit;
   memory;

a lens;
input-output circuitry; and
an imaging device, wherein the imaging device comprises:
- a substrate;
- a photodiode formed in the substrate;
- a storage diode formed in the substrate;
- a shallow trench isolation (STI) structure formed in the substrate between the photodiode and the storage diode;
- a conductive via that is formed through the STI structure;
- a buried light shield that is formed at least partly over the storage diode, wherein the conductive via is coupled to the buried light shield; and
- an optically absorptive layer that is formed within the STI structure and that is electrically coupled to the conductive via, wherein the conductive via is formed separately from the optically absorptive layer.

8. The system defined in claim 7, wherein the optically absorptive layer is electrically biased to provide a potential barrier between the photodiode and the storage diode.

9. The system defined in claim 7, wherein the imaging device further comprises:
an optical isolation ring structure that is formed on the surface of the substrate.

10. The system defined in claim 9, wherein the optical isolation ring structure is formed from materials selected from the group consisting of: tungsten, tantalum, titanium, and nitride.

11. The system defined in claim 7, wherein the STI structure has first and second opposing sides, wherein the optically absorptive layer is on the first side of the STI structure, wherein the buried light shield is on the second side of the STI structure, and wherein the conductive via extends from the first side to the second side to couple the buried light shield to the optically absorptive layer.

* * * * *